(12) United States Patent
Lin et al.

(10) Patent No.: US 7,524,595 B2
(45) Date of Patent: Apr. 28, 2009

(54) PROCESS FOR FORMING ANTI-REFLECTION COATING AND METHOD FOR IMPROVING ACCURACY OF OVERLAY MEASUREMENT AND ALIGNMENT

(75) Inventors: Wen-Kuang Lin, Hsinchu (TW); Huan-Hsin Yeh, Cyonglin Township, Hsinchu County (TW); Chung-An Chen, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 680 days.

(21) Appl. No.: 11/223,497

(22) Filed: Sep. 8, 2005

(65) Prior Publication Data

US 2007/0054205 A1    Mar. 8, 2007

(51) Int. Cl.
*G03C 5/00* (2006.01)
*G03F 9/00* (2006.01)

(52) U.S. Cl. .......... 430/22; 430/315; 430/330; 430/510; 430/950

(58) Field of Classification Search ............ 430/22, 430/315, 330, 510, 950
See application file for complete search history.

(56) References Cited

U.S. PATENT DOCUMENTS

| 6,852,473 | B2 * | 2/2005 | Roberts et al. | 430/315 |
| 7,223,684 | B2 * | 5/2007 | McDevitt et al. | 438/618 |
| 2004/0058278 | A1 * | 3/2004 | Roberts et al. | 430/311 |

* cited by examiner

*Primary Examiner*—Christopher G Young
(74) *Attorney, Agent, or Firm*—J.C. Patents

(57) ABSTRACT

A method for forming an anti-reflection coating (ARC) with no hole over an overlay mark is described, which applies a fluid material of the ARC onto a substrate and then conducts at least two curing steps to convert the fluid material into the ARC. Such a bottom anti-reflection coating with no hole over the overlay mark can improve accuracy of the overlay measurement of lithography, thereby improving the alignment accuracy of the lithography process.

7 Claims, 1 Drawing Sheet

PROCESS FOR FORMING ANTI-REFLECTION COATING AND METHOD FOR IMPROVING ACCURACY OF OVERLAY MEASUREMENT AND ALIGNMENT

BACKGROUND OF THE INVENTION

1. Field of the Invention

The present invention relates to lithography technology. More particularly, the present invention relates to a process for forming an anti-reflection coating (ARC), a method for improving accuracy of overlay measurement based on the process, and a method for implementing alignment in lithography that includes the same process.

2. Description of the Related Art

In any semiconductor process, the alignment accuracy between the exposure system and wafers is a very important factor for correct connection between layers of different levels. Therefore, overlay marks are usually formed on a wafer, so that after a lithography process, overlay errors can be derived by measuring the relative displacement between the patterned photoresist layer and the overlay marks. The exposure system can be calibrated according to the overlay errors, so as to improve the alignment accuracy of subsequent wafers exposed with the same exposure system.

Moreover, to reduce the reflecting light from the surface of the layer to be patterned and thereby improve the profile of the photoresist pattern, a bottom anti-reflection coating (BARC) is usually formed on the layer before the photoresist material is applied. In the prior art, the BARC is formed through a single curing step.

FIG. 1A is a photograph of a substrate having an overlay mark, a BARC formed through a single curing step and a patterned photoresist layer thereon, and FIG. 1B illustrates a simplified cross-sectional view of the structure of FIG. 1A along line I-I'. The overlay mark 110 on the substrate 100 is constituted of four trenches 110a arranged in an unclosed square and a thin polysilicon layer 120 as a reflective layer that is formed conformally on the substrate 100 before the BARC 130. The portion of the patterned photoresist layer formed over the overlay mark 110 includes four rectangular patterns 140 arranged in a smaller unclosed square.

However, in the prior art, the portions of the BARC 130 in the trenches 110a is easily separated from the other portions outside the trenches 110a because of rapid curing in the single curing step, so that a hole 132 is formed around each trench 110a with a boundary 130a. The boundaries 130a will interfere with measurement of the overlay errors between the overlay mark 110 and the photoresist patterns 140, so that the overlay errors cannot be measured accurately. Since parameters of a lithography process cannot be adjusted accurately based on inaccurate overlay measurement, the alignment accuracy of subsequent wafers subject to the same lithography process cannot be improved effectively.

SUMMARY OF THE INVENTION

In view of the foregoing, one object of this invention is to provide a method for forming an anti-reflection coating (ARC).

Another object of this invention is to provide a method for improving the accuracy of overlay measurement of a lithography process, based on that the BARC is formed with no hole over the overlay mark.

Still another object of this invention is to provide a method for implementing alignment in a lithography process, wherein a BARC is formed with no hole over the overlay mark, so that the subsequent overlay measurement is more accurate allowing better alignment to be achieved.

In the method for forming an ARC of this invention, a fluid material of ARC is applied onto a substrate, and then at least two curing steps are conducted to convert the fluid material into an ARC.

In the method for improving accuracy of overlay measurement of a lithography process of this invention, the lithography process is a process that forms a patterned photoresist layer over a substrate having an overlay mark thereon after the BARC is formed. The features of the method include at least that the BARC is formed through at least two curing steps conducted to an fluid material of the BARC.

The method for implementing alignment in a lithography process is described as follows. A substrate with an overlay mark thereon is provided, and then a BARC is formed on the substrate through at least two curing steps conducted to an fluid material of the BARC. The lithography process is performed to form patterned photoresist on the BARC, and then the overlay errors between the overlay mark and the patterned photoresist are measured. The parameters of the lithography process are then adjusted based on the overlay errors to align later substrates subject to the lithography process.

With the above two- or multi-step curing process of this invention, the BARC can be formed with no hole over the overlay mark. Hence, the overlay measurement of the lithography process is more accurate, so that the parameters of the lithography process can be adjusted more accurately to improve the alignment accuracy.

It is to be understood that both the foregoing general description and the following detailed description are exemplary, and are intended to provide further explanation of the invention as claimed.

DESCRIPTION OF THE PREFERRED EMBODIMENTS

This invention will be explained with a method for implementing alignment in a lithography process according to a preferred embodiment of this invention. A process for forming an ARC and a method for improving accuracy of overlay measurement of a lithography process according to the preferred embodiment of this invention are also explained in the following description.

Figure 1A:
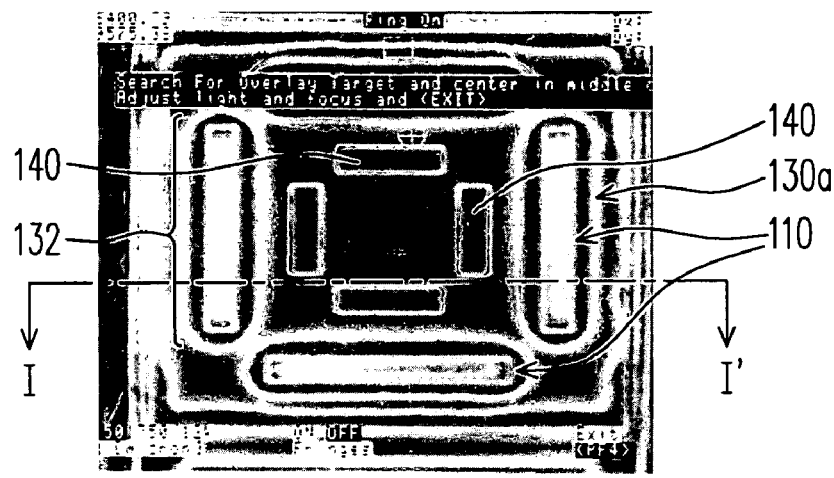
FIG. 1A is a photograph of a substrate having an overlay mark, a BARC formed through a single curing step of the prior art and a patterned photoresist layer thereon.
Figure 1B:
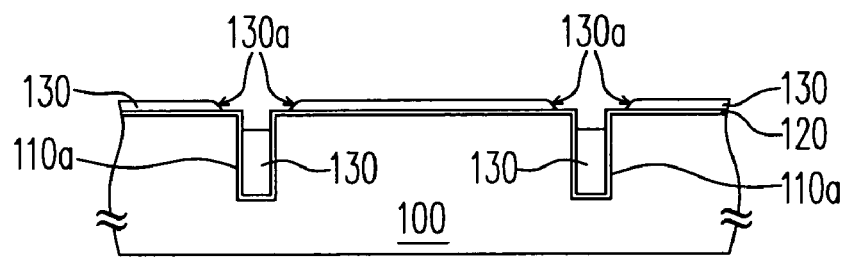
FIG. 1B illustrates a simplified cross-sectional view of the structure of FIG. 1A along line I-I'.
Figure 2A:
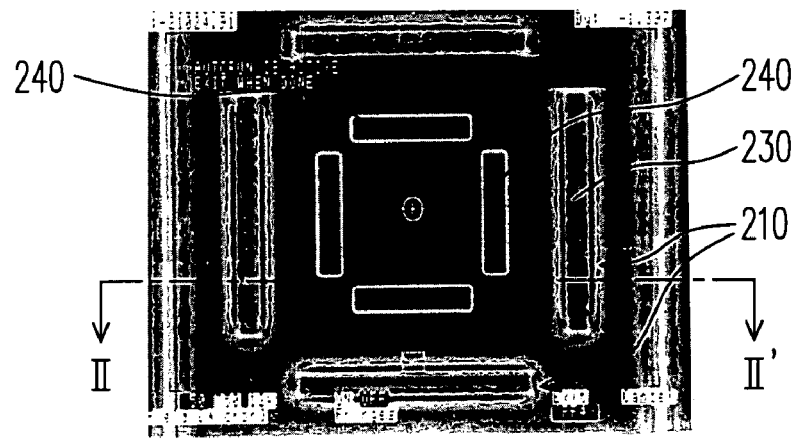
FIG. 2A is a photograph of a substrate having an overlay mark, a BARC formed through two-step curing of this invention and a patterned photoresist layer thereon.
Figure 2B:
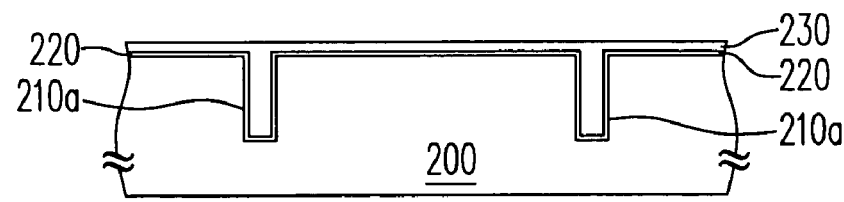
FIG. 2B illustrates a simplified cross-sectional view of the structure of FIG. 2A along line II-II'.

Referring to FIG. 2A/B, in the method for implementing alignment in a lithography process, a substrate 200 with an overlay mark 210 thereon is provided. The overlay mark 210 includes four trenches 210a arranged in an unclosed square and a reflective layer 220 formed substantially conformally over the substrate 200 and the trenches 210a, wherein the material of the reflective layer 220 may be poly-Si or metal.

Thereafter, a BARC 230 is formed covering the substrate 200 with no hole over the overlay mark 210. The BARC 230 is formed by applying a fluid material of ARC onto the substrate 200 and then performing a two-step curing process including a first and a second curing steps to the fluid material. The temperature of the first curing step is preferably lower than that of the second curing step, so that the fluid material can be cured smoothly. In such cases, the first curing step causes partial crosslinking in the fluid material, while the second curing step completes the crosslinking reaction and entirely removes the solvent from the fluid material. The preferable conditions of the first and second curing steps are listed in Table 1:

TABLE 1

|  | Temperature (° C.) | Time (sec) |
| --- | --- | --- |
| $1^{st}$ curing step | 60-150 | 30-90 |
| $2^{nd}$ curing step | 185-245 | 30-120 |

Referring to FIG. 2A, a lithography process is then performed to form a patterned photoresist layer 240 on the BARC 230, wherein the portion of the patterned photoresist layer 240 over the overlay mark 210 includes four rectangular patterns arranged in a smaller unclosed square within the larger unclosed square constituted of the four trenches 210a.

Thereafter, the overlay errors between the overlay mark 210 and the patterned photoresist layer 240 are measured, wherein the measurement is generally based on the variation of reflectivity across the overlay mark 210 and the photoresist patterns 240. Since the BARC 230 formed through the two-step curing process does not have holes over the alignment mark 210, no hole boundary is formed interfering with the overlay measurement, as shown in the photograph of FIG. 2A. Consequently, the overlay measurement can be more accurate as compared with the prior art.

Moreover, since the parameters of the lithography process can be adjust more accurately according to the more accurate results of overlay measurement, the alignment accuracy of subsequent substrates subject to the same lithography process can be improved effectively.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A process for forming an anti-reflection coating, comprising:

applying a fluid material of the anti-reflection coating onto a substrate; and conducting at least two curing steps to convert the fluid material into the anti-reflection coating, wherein the at least two curing steps include a first curing step and a second curing step, and a first temperature of the first curing step is lower than a second temperature of the second curing step.

2. The process of claim 1, wherein the first curing step is conducted at 60-150°C. for 30-90 seconds, and the second curing step is conducted at 185-245°C. for 30-120 seconds.

3. The process of claim 1, wherein the substrate has been formed with an overlay mark thereon before the fluid material is applied; and the at least two curing steps are conducted such that no hole is formed in the anti-reflection coating over the overlay mark.

4. A method for improving accuracy of overlay measurement of a lithography process that forms patterned photoresist on a substrate with an overlay mark thereon after a bottom anti-reflection coating (BARC) is formed, comprising:

forming the BARC through at least two curing steps conducted to a fluid material of the BARC that is applied to the substrate, wherein the at least two curing steps are conducted such that no hole is formed in the BARC over the overlay mark, the at least two curing steps include a first curing step and a second curing step, and a first temperature of the first curing step is lower than a second temperature of the second curing step.

5. The method of claim 4, wherein the first curing step is conducted at 60-150°C. for 30-90 seconds, and the second curing step is conducted at 185-245°C. for 30-120 seconds.

6. A method for implementing alignment in a lithography process, comprising:

providing a substrate with an overlay mark thereon;

forming a BARC on the substrate, the BARC being formed through at least two curing steps conducted to an fluid material of the BARC and having no hole therein over the overlay mark, wherein the at least two curing steps include a first curing step and a second curing step, and a first temperature of the first curing step is lower than a second temperature of the second curing step;

performing the lithography process to form patterned photoresist on the BARC;

measuring overlay errors between the overlay mark and the patterned photoresist; and adjusting parameters of the lithography process based on the overlay errors to align later substrates subject to the lithography process.

7. The method of claim 6, wherein the first curing step is conducted at 60-150°C. for 30-90 seconds, and the second curing step is conducted at 185-245°C. for 30-120 seconds.

* * * * *